US006955285B2

(12) United States Patent
Nomoto et al.

(10) Patent No.: US 6,955,285 B2
(45) Date of Patent: Oct. 18, 2005

(54) APPARATUS FOR ALIGNING AND DISPENSING SOLDER COLUMNS IN AN ARRAY

(75) Inventors: Shinichi Nomoto, Tokyo (JP); Takashi Nauchi, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 122 days.

(21) Appl. No.: 10/734,234

(22) Filed: Dec. 15, 2003

(65) Prior Publication Data

US 2004/0124225 A1   Jul. 1, 2004

(30) Foreign Application Priority Data

Dec. 17, 2002   (JP) .............................. 2002-364913

(51) Int. Cl.[7] .......................... B23K 1/00; B23K 20/14; B23K 1/08; B23K 35/12
(52) U.S. Cl. .......................... 228/41; 228/39; 228/56.3; 228/214; 228/246
(58) Field of Search .......................... 228/39, 41, 56.3, 228/214, 245, 246, 256

(56) References Cited

U.S. PATENT DOCUMENTS

| 4,142,286 | A | * | 3/1979 | Knuth et al. .................. 29/852 |
| 4,206,542 | A | * | 6/1980 | Reavill ......................... 29/877 |
| 5,403,776 | A | | 4/1995 | Tsuji et al. |
| 5,626,278 | A | | 5/1997 | Tang |
| 6,251,767 | B1 | | 6/2001 | Heinen |
| 6,254,923 | B1 | | 7/2001 | Boyd et al. |
| 6,276,596 | B1 | * | 8/2001 | Gruber et al. ............... 228/225 |
| 6,604,673 | B1 | * | 8/2003 | Bourrieres et al. ......... 228/246 |
| 2002/0102767 | A1 | | 8/2002 | Sturcken et al. |
| 2004/0144834 | A1 | * | 7/2004 | Nomoto et al. ........... 228/180.1 |

FOREIGN PATENT DOCUMENTS

JP    10-139133 A   *   5/1998
JP    11-319722 A   *  11/1999

* cited by examiner

*Primary Examiner*—Lynne R. Edmondson
(74) *Attorney, Agent, or Firm*—Wenderoth, Lind & Ponack, L.L.P.

(57) ABSTRACT

An apparatus for aligning and dispensing a plurality of solder columns in an array. The apparatus includes a vibrator and an elongated alignment plate supported on the vibrator. The alignment plate includes a plurality of longitudinal guide grooves. A transparent cover is secured on the alignment plate and shaped to cover part of the guide grooves. A parts feeder is operatively associated with the alignment plate to feed solder columns over the upstream end of the alignment plate. The solder columns are received in the guide grooves and fed toward the downstream end of the alignment plate while the alignment plate is vibrated by the vibrator. The solder columns are arranged in an array within the guide grooves so that a vacuum pickup tool may readily capture the cylindrical body of the solder columns.

7 Claims, 3 Drawing Sheets

APPARATUS FOR ALIGNING AND DISPENSING SOLDER COLUMNS IN AN ARRAY

BACKGROUND OF THE INVENTION

The present invention relates generally to column grid arrays for semiconductor packaging and more particularly, to an apparatus for aligning and dispensing a plurality of solder columns in an array. After alignment, the solder columns are positioned in an array of corresponding electrically conductive contact pads or terminals disposed on one side of a ceramic substrate. The solder columns are reflowed in an oven and then, attached to the substrate to form a ceramic column grid array package.

As the density of electronic devices on integrated circuits has continued to increase, the number of leads required for a chip has also increased. To handle the increased density, there has been developed a ball grid array package wherein one or more chips are mounted on the top surface of a substrate. The ball grid array package uses an array of solder balls to provide electrical connections between the substrate and a printed circuit board. A problem with this type of package is that substantial differences in the thermal coefficient of expansion can exit between the substrate and the printed circuit board. Such differences in the thermal coefficient of expansion cause plastic deformation of the solder balls.

This problem has been addressed by the use of a ceramic column grid array package. The column grid array package uses an array of solder columns, rather than solder balls, to make electrical connections between a ceramic substrate and a printed circuit board. The solder columns typically have a height of approximately 2.55 mm and a diameter of 0.50 mm. The taller configuration of the solder columns offers compliancy to better absorb the differential thermal expansion rate between the ceramic column grid array package and the printed circuit board. To attach the solder columns to the semiconductor substrate, a low melting temperature solder paste is deposited on electrically conductive contact pads which are, in turn, placed on one side of the ceramic substrate. The solder columns, typically made from a high melting temperature solder using a nominal 90/10 alloy of lead to tin, are vertically positioned on the corresponding contact pads. The combination is then heated in a reflow oven so that the solder paste is reflowed to make a connection between the solder columns and the pads. Like procedure takes place when the solder columns are attached to the printed circuit board.

In the manufacture of a ball grid array package, a vacuum pickup tool is typically used to pick up and place a multiplicity of solder balls in the desired pattern on a semiconductor substrate. The spherical shape of the solder balls makes it easier to pick up and place a full array of solder balls on the substrate. On the other hand, solder columns have a cylindrical shape and must, therefore, be arranged in a fixed orientation during pickup. No means has heretofore been proposed to align a multiplicity of solder columns in an array before the solder columns are picked up.

Accordingly, it is an object of the present invention to provide an apparatus for aligning and dispensing a plurality of solder columns in an array, so that all the solder columns can readily be picked up by a vacuum pickup tool.

SUMMARY OF THE INVENTION

According to the present invention, there is provided an apparatus for aligning and dispensing a plurality of solder columns in an array, which includes a vibrator and a substantially planar, elongated alignment plate supported on the vibrator. After alignment, the solder columns are positioned in electrically conductive contact pads or terminals which are disposed on one side of a ceramic substrate. One or more chips are mounted on the other side of the substrate. The solder columns and the substrate are headed in a reflow oven so that the solder columns are adhered to the substrate to form a ceramic column grid array. The alignment plate includes a plurality of longitudinal guide grooves. The guide grooves are equal in number to the terminals and spaced from each other by a distance substantially equal to the space between each adjacent terminals. A substantially planar cover is fixedly mounted to the alignment plate and shaped to cover part of the guide grooves. A source of solder columns or parts feeder is operatively associated with the alignment plate and adapted to feed or scatter the solder columns over the upstream end of the alignment plate. The solder columns are received in the guide grooves and then fed toward the downstream end of the alignment plate while the alignment plate is vibrated in a longitudinal direction by the vibrator.

In one embodiment, the cover has an upstream end inclined relative to the longitudinal axis of the alignment plate and a straight downstream end. The inclined upstream end of the cover is spaced from the upstream end of the alignment plate so that the solder columns may be fully scattered over the upstream end of the alignment plate. The downstream end of the cover is spaced from the downstream end of the alignment plate by a distance greater than the length of the single solder column and less than twice the length of the solder column. The cover not only removes solder columns which are not received within the guide grooves, or which remain on other solder columns received within the guide grooves, but also, prevents the escape of solder columns once received within the guide grooves. The inclined upstream end of the cover effectively causes those solder columns which are outside of the guide grooves to fall off of the alignment plate. The cover may preferably be transparent.

Preferably, an end plate may be secured to the downstream end of the alignment plate to hold a leading array of solder columns in place within the guide grooves. A vacuum pickup tool may be moved to the downstream end of the alignment plate to pick up the solder columns. Since all the solder columns in the leading array are arranged in the same orientation, the vacuum pickup tool can readily capture the cylindrical body of the solder columns.

In one embodiment, the guide grooves have a width slightly greater than the diameter of the solder columns so that the solder columns may smoothly be slid within the guide grooves. The guide grooves have a rectangular cross section. Alternatively, the guide grooves may have a V-shaped or semicircular cross section.

The above and other objects, features and advantages of the present invention will become apparent from the following detailed description of the preferred embodiments of the invention.

DETAILED DESCRIPTION OF THE INVENTION

Figure 1:
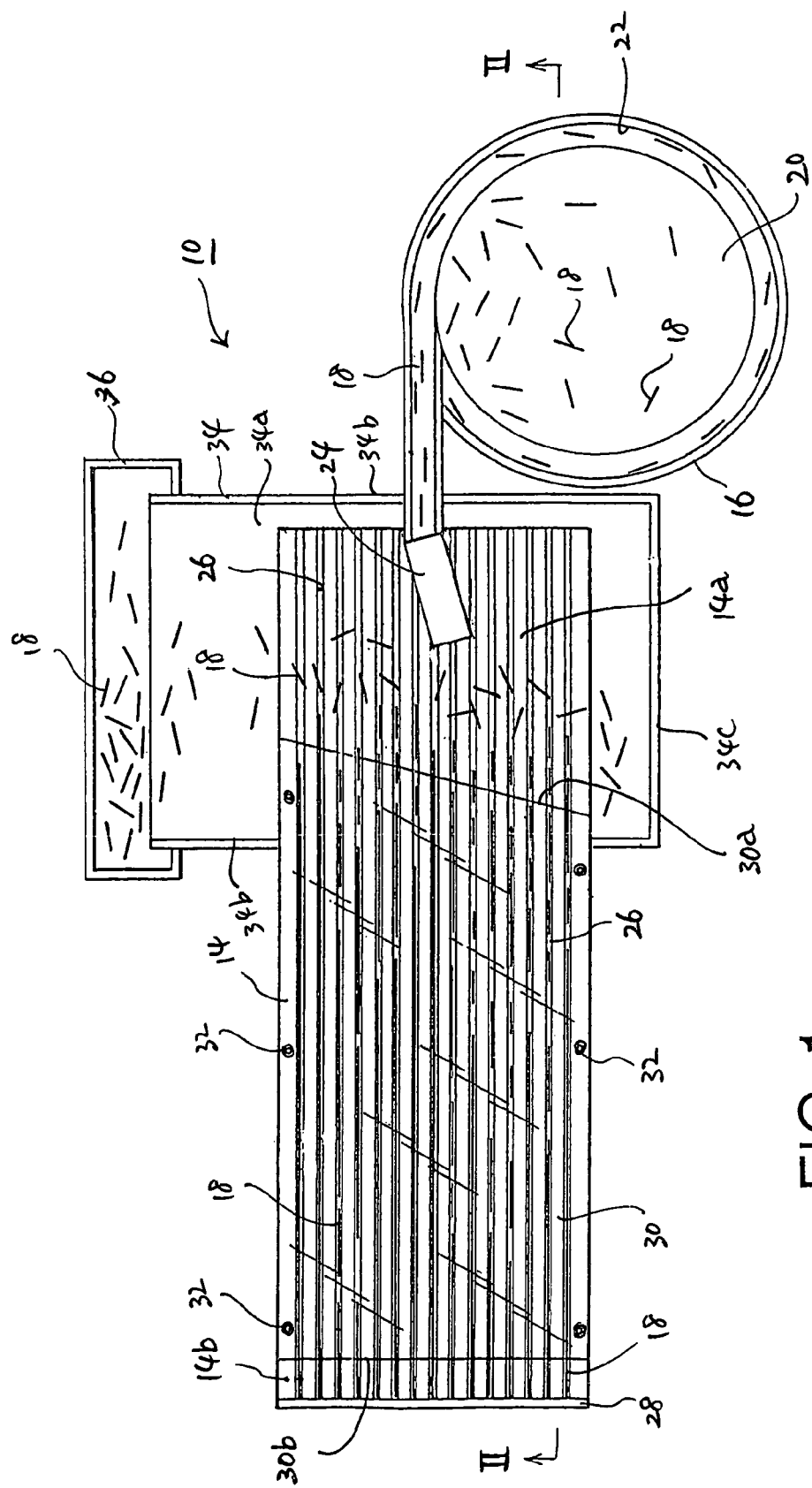
FIG. 1 is a top plan view of an apparatus for aligning and dispensing a plurality of solder columns in an array, assembled according to one embodiment of the present invention.
Figure 2:
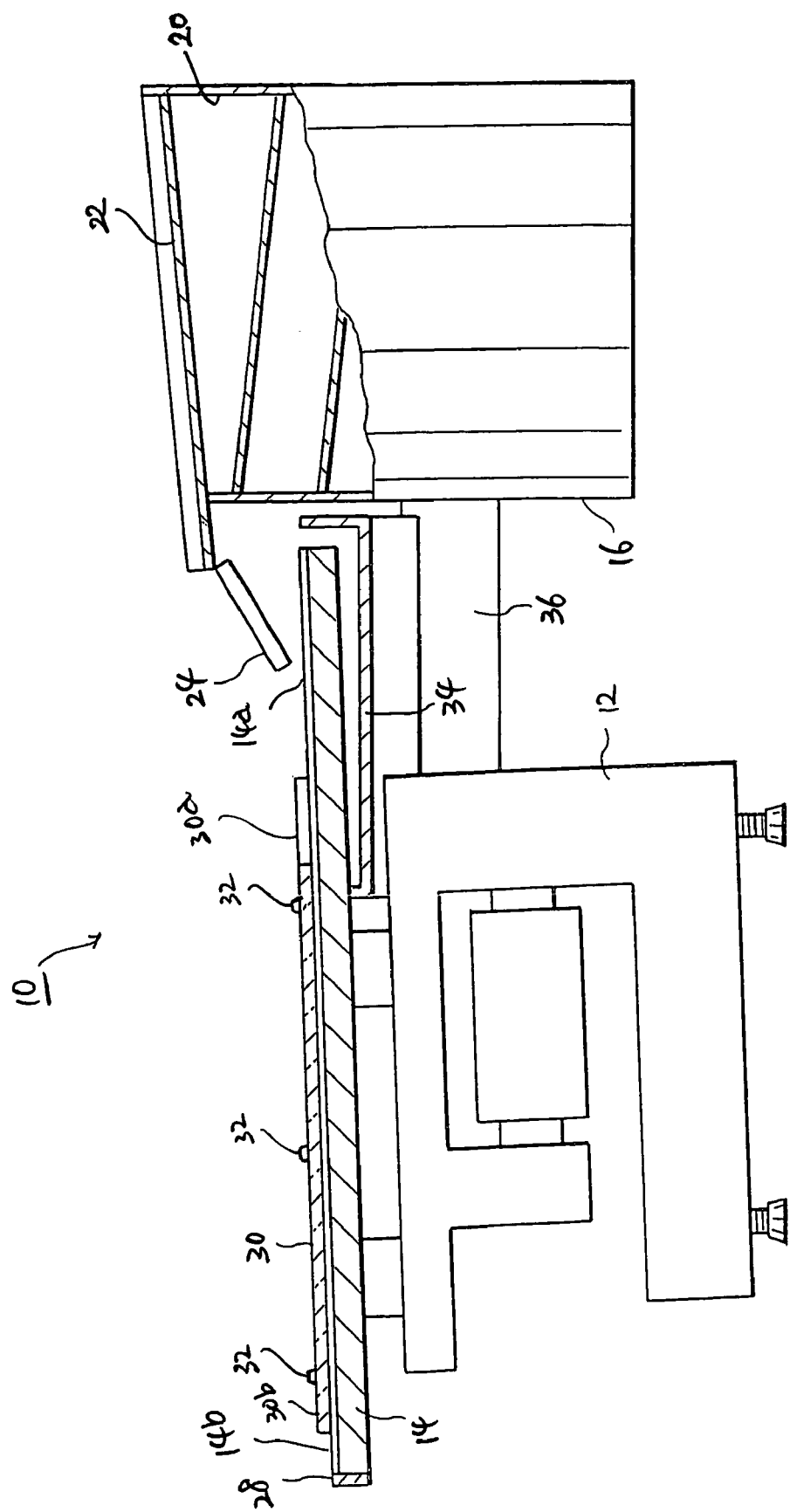
FIG. 2 is a longitudinal sectional view taken on line II—II in FIG. 1.

Referring first to FIGS. 1 and 2, there is shown an apparatus, generally designated at 10, for aligning and dispensing a plurality of solder columns in an array according to one embodiment of the present invention. The apparatus 10 includes a vibrator 12 on which an elongated alignment plate 14 is supported. The vibrator 12 is operable to impart vibrations to the alignment plate 14, as will later be described.

The alignment plate 14 is generally rectangular in shape and has an upstream end 14a and a downstream end 14b. The alignment plate 14 is slightly downwardly inclined from the upstream end 14a toward the downstream end 14b. Located adjacent to the upstream end 14a of the alignment plate 14 is a parts feeder 16 as a source of solder columns 18. The parts feeder 16 includes a feeder bawl 20. A spiral track 22 extends around the inner surface of the feeder bawl 20 and terminates at an outlet 24. The outlet 24 is located above the upstream end 14a of the alignment plate 14. As better shown in FIG. 1, the solder columns 18, when fed from the feeder bawl 20 through the outlet 24, are scattered over the upstream end 14a of the alignment plate 14.

Figure 3:
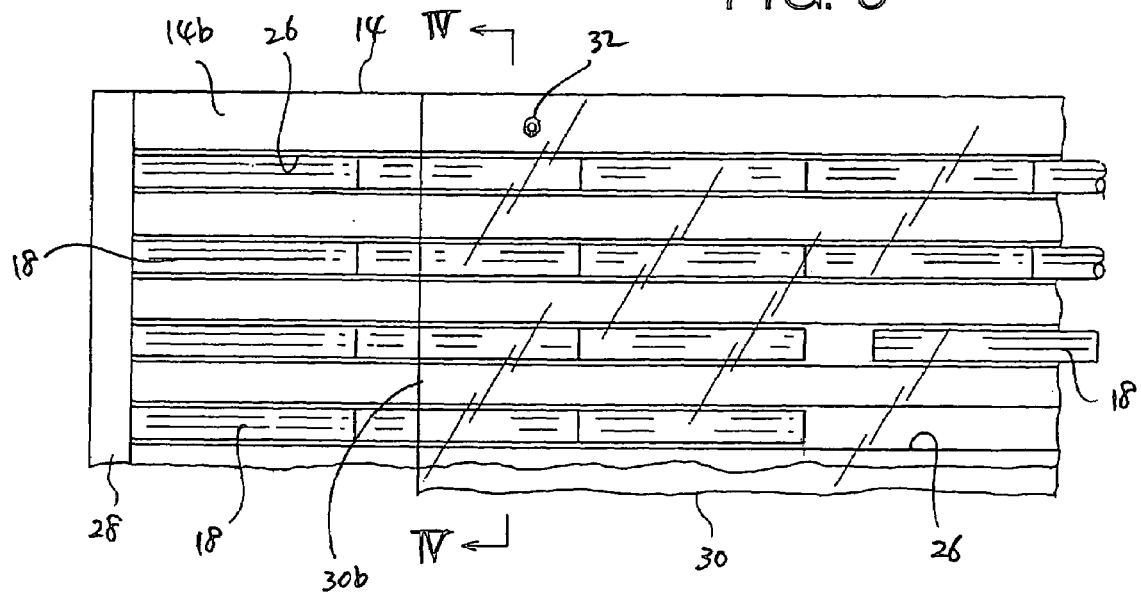
FIG. 3 is an enlarged partial view of the downstream end of an alignment plate used in the apparatus shown in FIG. 1.
Figure 4:
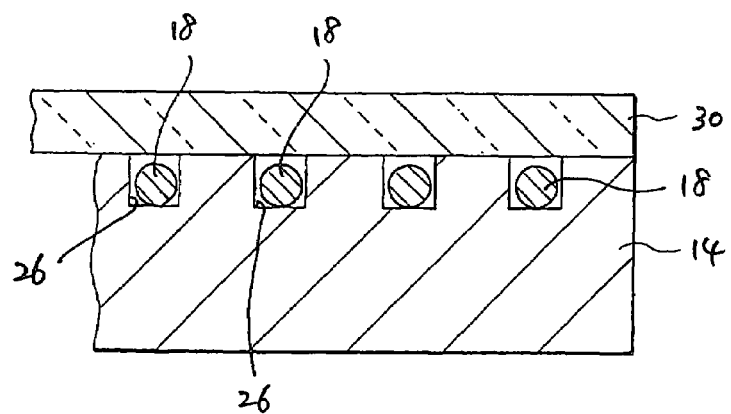
FIG. 4 is a transverse sectional view taken on line IV—IV in FIG. 3.

A plurality of longitudinal guide grooves 26 are defined in the alignment plate 14 to receive and guide the solder columns 18. The guide grooves 26 extend generally parallel to each other. The number of the guide grooves 26 is equal to the number of electrically conductive contact pads or terminals (not shown) disposed on one side of a substrate of a ceramic column grid array package (not shown). The space between each adjacent guide grooves 26 is also equal to the space between each adjacent contact pads. As shown in FIG. 4, the guide grooves have, but not limited to, a rectangular cross section. The guide grooves 26 have a width slightly greater than the diameter of the solder columns 18 so that the solder columns 18 can readily be slid within the guide grooves 26. An end plate or stopper 28 is secured to the downstream end 14b of the alignment plate 14 to hold a leading array of solder columns 18 in place, as shown in FIG. 3.

A substantially planar transparent cover 30 is fixedly mounted on the upper surface of the alignment plate 14 by bolts 32. The transparent cover 30 has an upstream end 30a and a downstream end 30b. The upstream end 30a of the cover 30 is inclined relative to the longitudinal axis of the alignment plate 14. The inclined upstream end 30a of the cover 30 is spaced a sufficient distance from the outlet 24 to permit scattering of the solder columns 18 over the upstream end 14a of the alignment plate 14. As better shown in FIG. 3, the straight downstream end 30b of the cover 30 is spaced from the straight downstream end 14b of the alignment plate 14 by a distance slightly greater than the length of the single solder column 18. Preferably, this distance is less than twice the length of the solder column.

An inclined collection tray or chute 34 is supported on the vibrator 12 and located below and adjacent to the upstream end 14a of the alignment plate 14 so as to collect those solder columns 18 which are not properly received in any of the guide grooves 26. The collection chute 34 has a planar base or bottom plate 34a, a pair of side plates 34b secured to opposite sides of the bottom plate 34a, and an end plate 34c secured to the upper end of the bottom plate 34a. A rectangular collection box 36 is located adjacent to the open lower end of the collection chute 34 to receive solder columns from the collection chute 34.

In operation, the vibrator 12 is rendered operative to vibrate the alignment plate 14 in the longitudinal direction. At the same time, the parts feeder 16 is rendered operative to feed the solder columns 18 upwardly along the track 22 of the feeder bawl 20. The solder columns 18 are then fed out of the feeder bawl 20 through the outlet 24 and scattered over the upstream end 14a of the alignment plate 14. A substantial part of the solder columns 18 is received in the guide grooves 26. However, some of the solder columns 18 may remain outside the guide grooves 26. Those solder columns are brought into contact with the inclined upstream end 30a of the transparent cover 30 while the alignment plate 14 is vibrated by the vibrator 12. The inclined upstream end 30a of the cover effectively causes those solder columns to slide on the collection chute 34 and fall into the collection box 36.

The solder columns 18, fully received within the guide grooves 26, are fed toward the downstream end 14b of the alignment plate 14 during vibration of the alignment plate 14 and arranged in an end-to-end relationship. As shown in FIG. 3, the leading solder columns in the respective guide grooves 26 are stopped when they are brought into contact with the end plate 28. These leading solder columns collectively form a first array of solder columns. A vacuum pickup tool or fixture (not shown) is moved to the downstream end 14b of the alignment plate 14. The vacuum pickup tool captures the cylindrical body of the solder columns 18 and then, transfers the solder columns 18 to a next station wherein the solder columns are attached to a ceramic substrate (not shown).

Although the present invention has been described with respect to its preferred embodiment, it is to be understood that various modifications and changes may be made without departing from the scope of the invention as defined by the appended claims.

What is claimed is:

1. An apparatus for aligning and dispensing a plurality of solder columns in an array, said array of solder columns being adapted to be attached to an array of corresponding terminals disposed on one side of a substrate of a ceramic column grid array package, said apparatus comprising:
   a vibrator;
   an elongated alignment member supported on said vibrator and including a plurality of longitudinal guide grooves, said guide grooves being equal in number to the terminals and spaced from each other by a distance substantially equal to the space between each adjacent terminals, said alignment member having an upstream end and a downstream end;
   a cover secured on said alignment member and shaped to cover part of said guide grooves; and
   a source of solder columns for feeding the solder columns over the upstream end of said alignment member so that the solder columns are received in said guide grooves while said alignment member is vibrated by said vibrator.

2. The apparatus of claim 1, wherein said alignment member has a longitudinal axis, and said cover has an upstream end inclined relative to the longitudinal axis of said alignment member and a straight downstream end, said inclined upstream end of said cover being spaced from the upstream end of said alignment member so that the solder columns may be scattered over the upstream end of said alignment member, and said downstream end of said cover being spaced from the downstream end of said alignment member by a distance greater than the length of the single solder column and less than twice the length of the solder column.

3. The apparatus of claim 2, wherein said cover is transparent.

4. The apparatus of claim 1, wherein said alignment member is downwardly inclined from the upstream end toward the downstream end.

5. The apparatus of claim 1, further comprising an end plate secured to the downstream end of said alignment member.

6. The apparatus of claim 1, wherein said guide grooves have a width slightly greater than the diameter of the solder columns.

7. The apparatus of claim 1, further comprising an inclined collection chute operatively associated with and located below said alignment member, said collection chute including a bottom plate having upper and lower ends and opposite sides extending between the upper and lower ends, a pair of side plates secured to the sides of said bottom plate, and an end plate secured to the upper end of said bottom plate, and a collection box located adjacent to the lower end of the bottom plate.

* * * * *